United States Patent [19]
Humer

[11] 3,932,023
[45] Jan. 13, 1976

[54] OPTICAL COUPLER FOR TRANSMITTING LIGHT LINEARLY BETWEEN A SINGLE POINT AND PLURAL POINTS

[75] Inventor: Donald D. Humer, Dover, Pa.

[73] Assignee: E. I. Du Pont de Nemours & Company, Wilmington, Del.

[22] Filed: Nov. 18, 1974

[21] Appl. No.: 524,524

[52] U.S. Cl. ............ 350/96 C; 350/96 B; 350/171; 350/174
[51] Int. Cl.² ...................................... G02B 27/14
[58] Field of Search ...... 350/96 C, 96 R, 96 B, 169, 350/171, 172, 174, 293; 356/236

[56] References Cited
UNITED STATES PATENTS

| | | |
|---|---|---|
| 3,101,411 | 8/1963 | Richards ..................... 350/96 B X |
| 3,455,625 | 7/1969 | Brumley et al. ................... 350/96 C |
| 3,455,637 | 7/1969 | Howard .............................. 356/204 |
| 3,638,008 | 1/1972 | Keller et al. ................. 350/96 C X |

*Primary Examiner*—Siegfried H. Grimm
*Attorney, Agent, or Firm*—Thomas Hooker

[57] ABSTRACT

An optical coupler having an integrating sphere, a photoreceptor on the sphere at one end of a diametral axis and a number of photoemitters on the sphere equidistant from the other end of the axis and aimed at the photoreceptor so that light signals from the photoemitters are linearly transmitted to the photoreceptor.

14 Claims, 4 Drawing Figures

OPTICAL COUPLER FOR TRANSMITTING LIGHT LINEARLY BETWEEN A SINGLE POINT AND PLURAL POINTS

The invention relates to an optical coupler whereby the light carried by each of a number of fiber optic members is linearly transmitted or coupled to a single photoreceptor so that the output of the receptor is linearly dependent upon the intensity of the light carried by each of the fiber optic members.

The optical coupler includes a body having an internal integrating sphere with a photoreceptor opening into the sphere and with each of a number of fiber optic members terminating on the sphere at locations equidistant from a point on the sphere diametrally opposed to the light-receiving window of the photoreceptor. The members are aimed at the window. With this construction, the photoreceptor views each fiber optic member equally and light transmitted through each fiber optic member is received equally by the photoreceptor. The portion of light from each fiber optic member which does not strike the light-receiving window of the photoreceptor is equally reflected over the surface of the sphere and, in part is reflected back to the light-receiving window from the portion of the sphere opposite the window. In this way, further light from each fiber optic member is linearly transmitted to the photoreceptor.

The optical coupler is particularly useful in providing a single output from a number of optical inputs where the output must reflect the linear sum of the optical inputs. One example of such an application is in a musical instrument where a different frequency optical signal is supplied to each fiber optic member. This signal may be pulsed at a frequency corresponding to the audio frequency of a given musical note. The pulses may be turned on and off in response to depression of keys. The sum of the signals carried by the fiber optic members is linearly coupled to the photoreceptor to provide an input for an audio amplifier.

Other objects and features of the invention will become apparent as the description proceeds, especially when taken in conjunction with the accompanying drawings illustrating the invention, of which there are two sheets.

IN THE DRAWINGS

Figure 1:
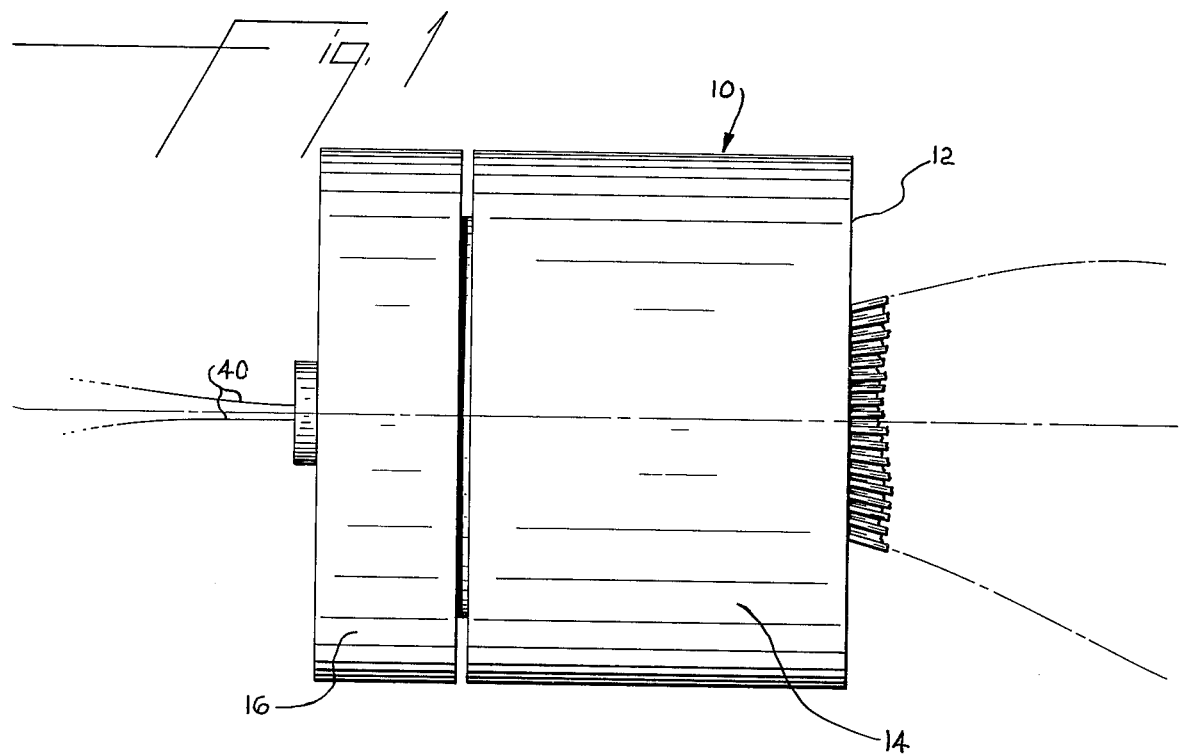
FIG. 1 is a side elevational view of an optical coupler according to the invention.
Figure 2:
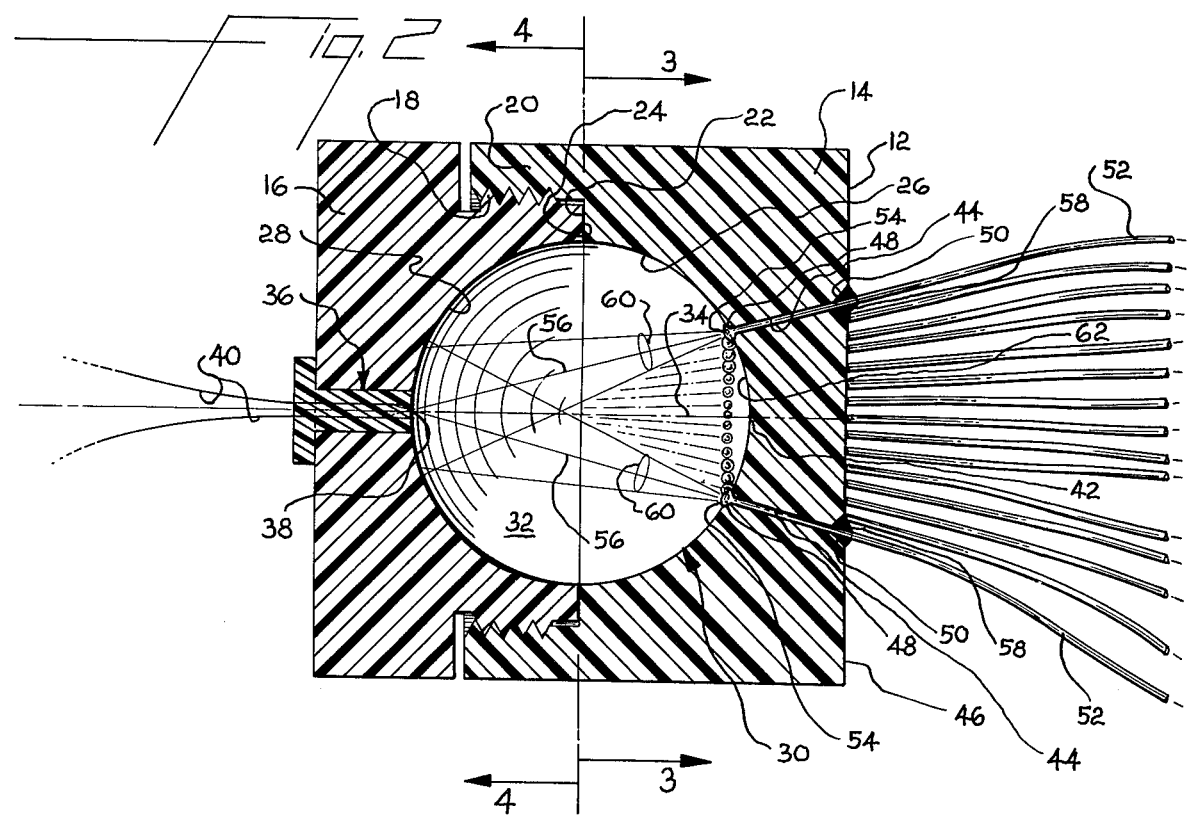
FIG. 2 is a sectional view taken through the coupler of FIG. 1.
Figure 3:
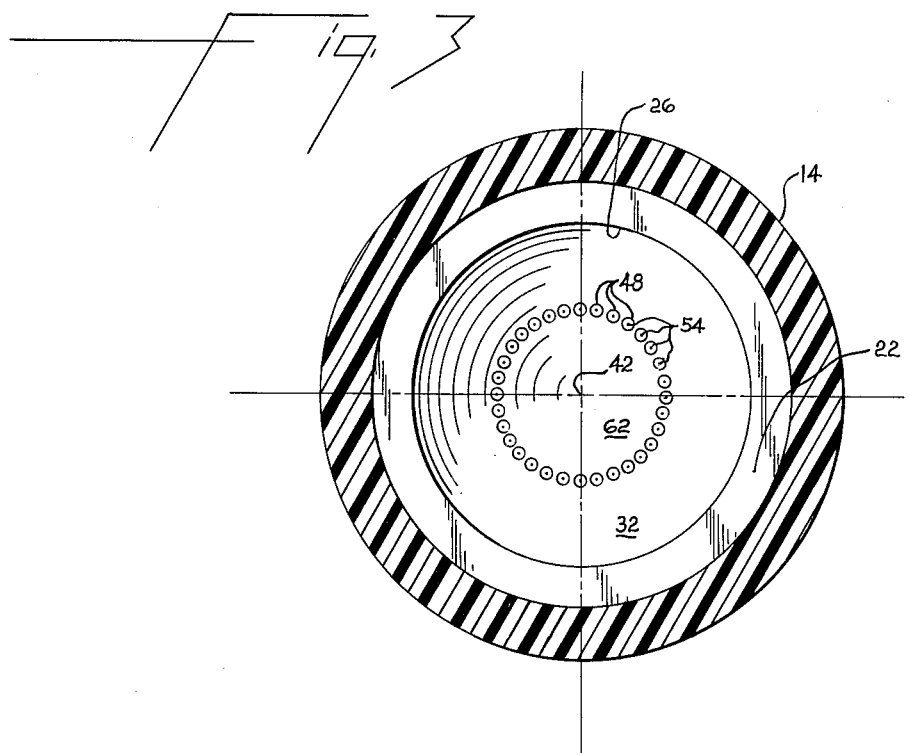
Figure 4:
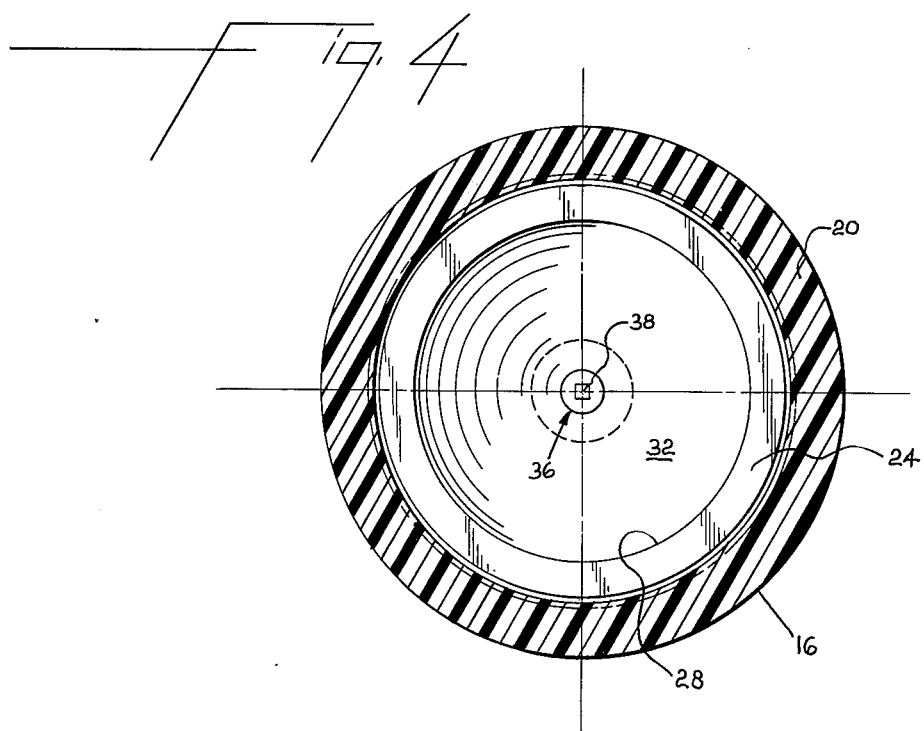

FIGS. 3 and 4 are sectional views taken along lines 3—3 and 4—4 of FIG. 2, respectively.

Optical coupler 10 includes a body 12 having body members 14 and 16 secured together as shown in FIG. 2. The body member 16 has a cylindrical exteriorly threaded portion 18 engagable with interiorly threaded portion 20 of body member 14 so that flat faces 22 and 24 of members 14 and 16 are brought into flush engagement with each other when the members are screwed together as shown in FIG. 2. A hollow semi-spherical recess 26 is formed in face 22 of member 14 and a hollow semi-spherical recess 28, having the same radius as recess 26, is formed in face 24 of body member 16. When the two members are secured together as in FIG. 2, the recesses 26 and 28 are joined to form an optically reflective integrating sphere 30 within body 12. The interior surface 32 of integrating sphere 30 reflects light directed against it.

For ease of description, the optical coupler 10 will be described with reference to a diametral axis 34 which extends through the center of the integrating sphere 30 perpendicular to the planar end faces 22 and 24. A photoreceptor 36 is mounted in block 16 with a light-receiving window 38 on the surface of the sphere in alignment with axis 34. Light striking this window will be sensed by the photoreceptor 36. Any of a number of types of photoreceptors may be used. For instance, the photoreceptor may be a photo cell, a photo transistor, or a photo diode. The foregoing elements are used to provide an electrical output in response to an optical input. Alternatively, the photoreceptor may be a fiber optic or other light-transmitting element which provides an optic output in response to the input received from the various sources, as described thereinafter. Other types of photoreceptors may be used. The disclosed photoreceptor 36 is of the electrical type and includes a pair of output leads 40 which are suitably connected to a device actuated by the photoreceptor.

The end of axis 34 away from window 38 intersects the surface of sphere 30 at point 42. A number of straight bores 44 extend from end wall 46 of member 14 through the thickness of the member and intersect the surface 32 of the sphere at beveled openings. Each opening 48 is equidistant from axial point 42 and the openings are spaced around point 42 in a circle as illustrated in FIG. 3. The axes of bores 44 lie on a cone having an apex at the light-receiving window 38. Beveled openings 50 are provided in the ends of the bores 44 at wall 46.

a fiber optic member 52 extends through each bore 44 and includes an integral lens 54 seated in a beveled opening 48 on the surface of the integrating sphere 30. The members 52 are held straight in the bores 44 so that they are aimed toward the light-receiving window 38, as indicated by lines 56 which are extensions of the axes of the bores. The bores 44 are sufficiently long so that the light carried by the members 52 in the bores is straightened and the ray of light passing through the lens 54 is symmetrically projected with respect to axis 56. In practice, using fiber optic members having a diameter of 0.03 cm., a bore length of 0.30 cm. is sufficient to straighten the light passing through the member.

The recesses 50 on surface 46 are filled with a suitable potting material 58 to secure the fiber optic members to the body and to provide a stress relief so that the fiber optic members may be bent, if desired.

Plastic or glass light-transmitting fiber optic members may be used in coupler 10. the ends of the members 52 away from the coupler are positioned to receive light, as desired, so that the light received by the members is transmitted along the length of the members, through the lenses 54 and into the interior of the integrating sphere. Light sources other than fiber optic members may be used to direct light into the integrating sphere of coupler 10.

The operation of the sphere to provide a linear photoreceptor output directly dependent upon the optical input of each fiber optic member 52 will now be described in detail.

In the integrating sphere 30, each fiber optic lens 54 is located equidistant from the light-receiving window 38 of the photoreceptor 36 and is viewed equally by the photoreceptor. The light passing through a fiber optic member 52 passes through the lens and radiates outwardly from the lens in a conical ray 60 having its axis of highest intensity aimed at the window 38. As this is true for each fiber optic member in the optical coupler 10, the maximum intensity light from each fiber optic is directed upon the window 38 at exactly the same angle so as to impart an output from the photoreceptor directly proportional to the amount of light passing through the individual fiber optic members. The remaining light in each cone of light 60 which does not strike the light-receiving window 38 strikes the interior surface 32 of the sphere and is reflected, by diffuse or spectral reflection, depending upon the nature of the surface 32, uniformly onto the entire surface of the sphere so that uniform light density on the entire surface is achieved. This means that the surface 62 of the sphere opposite the light-receiving window 38 receives an amount of light which is made up of portions directly proportional to the light received in the sphere from each fiber optic member 52. This light is reflected from surface 62 and some of it is directed to the light-receiving window 30 to further energize the photoreceptor 36 linearly in response to the light transmitted into the sphere from each fiber optic member.

In this manner, the photoreceptor receives an amount of light from each fiber optic member which, although it may be less than the total amount of light transmitted by the member into the integrating sphere, is directly proportional to that amount of light.

The distance at which the fiber optic members are spaced from point 42 depends upon the number of fiber optic members to be used in a given optical coupler. Obviously, with a larger number of fiber optic members, the spacing from point 42 is greater than as shown and with fewer members, the spacing will be reduced so that the axis 56 of each member will be more nearly parallel to axis 34 and the efficiency of the coupler will be increased.

A diffuse reflective surface is preferably provided on the integrating sphere 32, although a spectral reflective surface may be provided, if desired. In the case of a spectral reflective surface, there is the possibility that if the surface is not exactly spherical, the light emitted from the fiber optic members will not be uniformly distributed on the surface of the sphere and, as a consequence, the light reflected by surface 62 back into the light-receiving window will not be directly proportional to the light input from each fiber optic member. In some cases, an integrating sphere with a spectral reflective surface may be sufficiently accurate for a given purpose even with slight dimensional variations of the sphere.

The optical coupler described herein is used for integrating a number of signals received from a plurality of fiber optic members or other optical sources so that a single photoreceptor output is obtained. The coupler may also be used to provide an intensity equal light signal to fiber optic members. In such a case, a light source would replace the photoreceptor. The fiber optic members may be replaced by other light responsive elements. An equal amount of light would be directly reseived by each fiber optic member or element. The light from the source which is not aimed at the fiber optic members would be distributed uniformly on the surface of the sphere and, in part, would be reflected back to the individual symmetrically located fiber optic members or elements to increase the amount of light equally received by them.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my Invention is:

1. An optical coupler comprising a body having a hollow spherical interior surface, a photoreceptor mounted in the body with a light-receiving window on the surface of the sphere, and a plurality of light sources on the surface of the sphere, each light source being located equidistant from a point on the sphere diametrally opposed from said light-receiving window and aimed at said light-receiving window whereby light transmitted through the sources into the sphere linearly actuates said photoreceptor.

2. An optical coupler as in claim 1 wherein each of said sources comprises a fiber optic member extending through the body to the surface of the sphere, each fiber optic member being aimed directly at said ight-receiving window.

3. An optical coupler as in claim 2 wherein each fiber optic member includes a lens at the end thereof on the surface of the sphere.

4. An optical coupler as in claim 1 wherein the interior surface of the sphere is light-diffusing.

5. An optical coupler as in claim 1 wherein the interior surface of the sphere is spectral reflective.

6. An optical coupler as in claim 2, including bores extending through the body to the sphere, each bore closely confining a fiber optic member and having a length of about ten times the diameter of the fiber optic member so that the light carried in the fiber optic member is aimed at the light-receiving window.

7. An optical coupler comprising a body having a pair of body members, means for holding the body members together, a hollow spherical interior surface between said members, a photoreceptor mounted in one body member with a light-receiving window on the surface of the sphere, and a plurality of light sources mounted in said other body member on the surface of the sphere, each light source being located equidistant from a point on the sphere diametrally opposed from said light-receiving window and arranged in a circle surrounding said point, said light sources including light transmitting means extending outwardly of the sphere through alignment bores formed in said other body member, said bores being aimed at said light-receiving window whereby light transmitted through said light transmitting means and from said light sources into the sphere is aimed at said light-receiving window and linearly actuates said photoreceptor.

8. An optical coupler as in claim 7 wherein said light sources are comprised of fiber optic members.

9. An optical coupler as in claim 8 wherein the interior surface of the sphere is light-diffusing.

10. An optical coupler as in claim 9, including lenses on the ends of said fiber optic members.

11. An optical coupler comprising a body having a hollow interior recess of circular cross section in planes perpendicular to an axis extending across the recess, a photoreceptor mounted in the body with a light-receiving window on the surface of the recess at one end of the axis, and a plurality of light sources on the surface of the recess, each light source being located equidistant from the point of intersection of the other end of the axis with the surface of the recess and aimed at said window whereby light transmitted through the sources into the recess linearly actuates said photoreceptor.

12. An optical coupler comprising a body having a hollow spherical interior surface, a light source mounted in the body with a light-emitting window on the surface of the sphere, and a plurality of photoreceptors on the surface of the sphere, each photoreceptor being located equidistant from a point on the sphere diametrally opposed from said light-emitting window and aimed at said window whereby light transmitted through the window into the sphere linearly energizes said photoreceptors.

13. An optical coupler comprising a body having a hollow interior recess of circular cross section in planes perpendicular to an axis extending across the recess, a light source mounted in the body with a light-emitting window on the surface of the recess at one end of the axis, and a plurality of photoreceptors on the surface of the recess, each photoreceptor being located equidistant from the point of intersection of the other end of the axis with the surface of the recess and aimed at said window whereby light transmitted through the window into the surface linearly energizes said photoreceptors.

14. An optical coupler comprising a surface surrounding an interior volume and having a circular cross section in planes perpendicular to an axis extending across the volume, the interior side of the surface being light reflective, a first photo element on the surface at one end of the axis, a plurality of second photo elements on the surface, each second photo element being located equidistant from the other end of the axis, the optical axis of each second photo element being aimed at said first photo element, and either said first photo element being a photoreceptor and said second photo elements being photoemitters or said first photo element being a photoemitter and said second photo elements being photoreceptors, whereby light is linearly transmitted between said first photo element and said second photo element.

* * * * *